United States Patent [19]
Kato et al.

[11] Patent Number: 4,725,730
[45] Date of Patent: Feb. 16, 1988

[54] SYSTEM OF AUTOMATICALLY MEASURING SECTIONAL SHAPE

[75] Inventors: Makoto Kato, Kawasaki; Tetsuo Yokoyama, Nakano; Juntaro Arima, Katsuta; Shimbu Yamagata, Yokohama; Toshihiro Furuya, Katsuta, all of Japan

[73] Assignee: Hitachi, Ltd., Tokyo, Japan

[21] Appl. No.: 770,244

[22] Filed: Aug. 28, 1985

[30] Foreign Application Priority Data

Sep. 3, 1984 [JP] Japan ................... 59-182636

[51] Int. Cl.$^4$ .............................. G01N 23/00
[52] U.S. Cl. .................... 250/307; 250/310
[58] Field of Search ........... 250/310, 311, 307, 492.2

[56] References Cited

U.S. PATENT DOCUMENTS 4,039,829 8/1977 Kato et al. ................. 250/310
4,221,965 9/1980 Konishi et al. .............. 250/310

OTHER PUBLICATIONS

"Measurement of Specimen Height..." by A. Boyde, Scanning Electron Microscopy/1975 Eighth Annual Scanning Electron Micro. Symp. (4–1975).
"Measuring Surface Variations..." by Hoover Journal of Physics E: Scientific Instruments 1971, vol. 4.
"Stereoscopic Observation..." Karo et al., 10th Annual Scanning Electron Symposium (4–1977).
"Electron Microscopic Determination..." by Heiden reich et al., Journal of Applied Physics, vol. 15, May 1944.
"Digital Picture Processing" 2nd edition by Rosenfeld and Kak Published by Academic Press 1982, vol. 2, pp. 29–37.
IBM Technical Disclosure Bulletin, vol. 26, No. 1, Jun. 1983, pp. 189–190.
"Three-Dimensional Analysis of Stereoscopic Image" by Kobori et al. Info. Processing vol. 22, No. 9, pp. 846–855 (1981).

*Primary Examiner*—Craig E. Church
*Assistant Examiner*—John C. Freeman
*Attorney, Agent, or Firm*—Antonelli, Terry & Wands

[57] ABSTRACT

A stereoscopic measuring method and system for measuring the sectional shape of a step formed object such as a semiconductor element carrying a resist and wiring on a wafer. The method and system comprises the steps of means for detecting the images of the step formed object from at least two directions so as to form pictures corresponding to the images detected from different directions, determining the distances D between the upper and lower edges of a step in respective pictures; determining the angles θ of inclination of the edge lines with respect to the axis of the pictures, determining the angles of inclination of the standard plane fixed to the step formed object with respect to the viewing directions, and determining, as significant factors of the shape to be determined, the height H and width W of the step formed object.

4 Claims, 16 Drawing Figures

SYSTEM OF AUTOMATICALLY MEASURING SECTIONAL SHAPE

BACKGROUND OF THE INVENTION

The present invention relates to a system of measuring sectional shape of a minute pattern such as a resist or wiring on a semiconductor substrate. More particularly, the invention is concerned with an examination system in which a fast measurement of sectional shape, free from any fluctuation in the measuring object, is attained even from a deteriorated picture.

Hitherto, stereoscopic measurement has been used in various fields and uses such as formation of topographic map by aerial photography, microscopic three-dimensional observation of microscopic structure, and so forth. In this measuring method, much time and labor are required for the manual analysis of the data, therefore studies have been made for developing automatic analysis by computers. An example of such study is described in detail in "Three-Dimensional Analysis of Stereoscopic Image" by Tetsuo Kobori et al in INFORMATION PROCESSING Vol. 22, No. 9 pp. 846–855 (1981).

FIGS. 1(a) and 1(b) show, by way of example, a conventional method for detecting pictures of a specimen 2, in which the picture is sensed by an optical microscope 1 while a table 3 (see FIG. 1(a)) mounting the specimen 2 is tilted as indicated by 3' in FIG. 1(b).

FIGS. 2(a) and 2(b) show the pictures obtained by the method corresponding to FIGS. 1(a) and 1(b). These pictures are shown in the form of equi-altitude lines, so that the difference in altitude between two points marked at x and Δ can be known if the positions of these points are identified. In manual measurement, the operator inputs the coordinate values of the above-mentioned points by a known measure such as, for example, cursor, so that the value of the altitude difference can be obtained automatically.

When carrying out automatic measurement, it is necessary to locate the point appearing in FIG. 2(a) on the picture shown in FIG. 2(b).

Hitherto, this could be conducted by a method which will be explained hereinunder with reference to FIGS. 3(a) and 3(b). Namely, an area 4 of a certain size is defined in the picture shown in FIG. 3(a) around the point to be located, and a search area 5 which is considered to involve the point corresponding to the above-mentioned point in FIG. 3(a) is selected in the picture shown in FIG. 3(b). Usually, the search area 5 is determined to be somewhat greater than the window area 4 defined on the picture shown in FIG. 3(a). Then, the correlation between the window area 4 and the search area 5 is obtained, and the point shown in FIG. 4 which exhibits the maximum correlation value is determined as the corresponding point. This series of operations is referred to as "template matching", and is usually conducted through digital processing. Representing the number of picture elements (pixels) corresponding to one side of the window by N, the window size can be expressed by N×N in terms of the number of picture elements.

The gray level of the picture element (i,j) in FIG. 3(a) is expressed by Aij, while the gray level of the picture element (i',j') in FIG. 3(b) is expressed by Bi'j'. The correlation value between the window 4 around the picture element (i,j) in the picture shown in FIG. 3(a) and the search area 5 of the picture element (i',j') in the picture shown in FIG. 3(b) is expressed by the following formula (1) even in the simplest case.

$$\sum_{k=-\frac{N}{2}}^{\frac{N}{2}} \sum_{l=-\frac{N}{2}}^{\frac{N}{2}} A_{i-k,j-l} B_{i'-k,j'-l} \quad (1)$$

The computation of this formula requires multiplication $N^2$ times. Assuming that the size of the search area is expressed by M×M in terms of the number of picture elements, the correlation computation requires multiplication $M^2$ times. Consequently, multiplication $N^2 \times M^2$ times is required for obtaining correlation value between corresponding picture elements in the window 4 and the search area 5.

In a typical case of N=20 and M=100, multiplication 4,000,000 times is required to the desired template matching.

It is evident that template matching to determine the desired value requires considerable time. When the altitude difference is to be computed only with respect to the points and shown in FIGS. 3(a) and 3(b), the computation is affected by local deformation in the portion where the point exists. In addition, this conventional method inevitably suffers from problems such as instability due to noise produced by, for example, fluctuations in the acceleration voltage of the electron microscope.

The stereoscopic measurement described hereinbefore relies upon the principle of parallax. This principle is described in detail in, for example, "Digital Picture Processing", 2nd edition, by Azriel Rosenfeld & Avinash C. Kak, Published by Academic Press, 1982, Vol. 2, pp 29–37. An example of the simple application of this principle is shown in IBM Technical Disclosure Bulletin Vol. 26, No. 1, June 1983, pp 189–190.

SUMMARY OF THE INVENTION

Accordingly, an object of the invention is to provide an automatic sectional shape measuring method which can overcome the above-described problems of the prior art and which permits a fast measurement of sectional shape without being affected by any local fluctuation in the measured portion, from pictures which have been affected by noise produced by various causes such as fluctuation in the acceleration voltage in, for example, a scanning electron microscope which is used as the image detection of means for detection of the image to be measured.

To this end, according to the invention, the sectional shape can be measured precisely by making use of the characteristic form of edges such as the edges of resist and wiring on a wafer of a semiconductor element.

According to the invention, it is possible to attain fast measurement by virtue of elimination of time-consuming measuring steps such as template matching required in the conventional process.

DESCRIPTION OF THE PREFERRED EMBODIMENT

An embodiment of the invention will be described hereinunder with reference to the accompanying drawings.

Figure 1A:
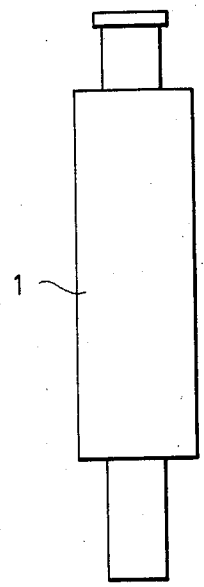
FIGS. 1(a) and 1(b) are illustrations of arrangement of an optical microscope and a specimen table in a conventional measuring method.
Figure 1A:
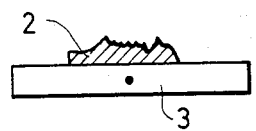
Figure 1B:
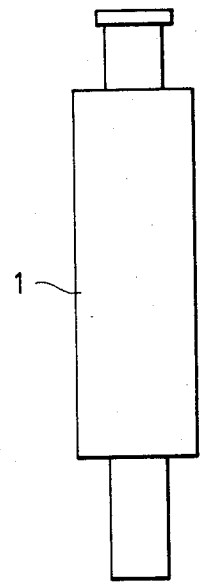
Figure 1B:
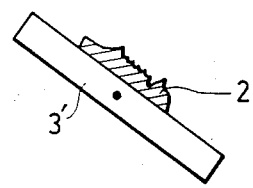
Figure 2A:
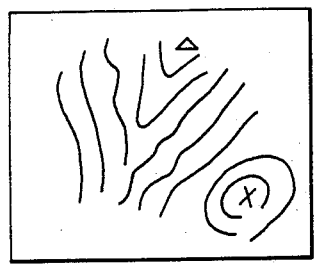
FIGS. 2(a) and 2(b) are illustrations of an example of pictures as obtained in the conventional measurement.
Figure 2B:
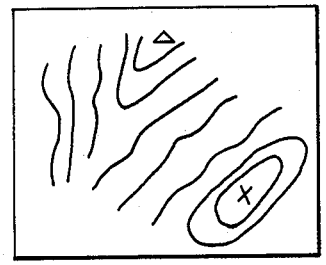
Figure 3A:
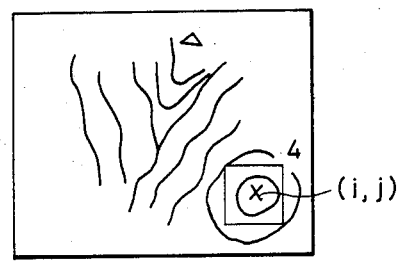
FIGS. 3(a) and 3(b) is an illustration of examples of an window and search area in template matching operation.
Figure 3B:
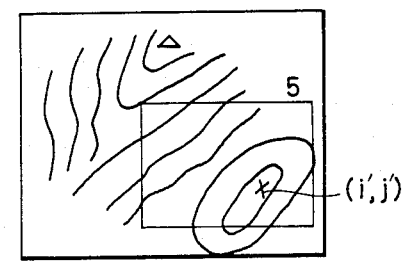
Figure 4:
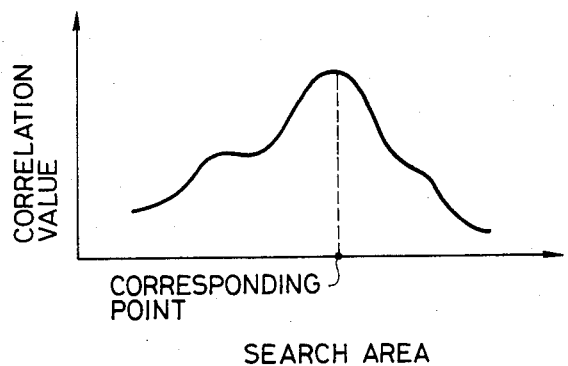
FIG. 4 is an illustration of relation between a position shown in search area in FIG. 3(b) and the correlation value between the position in the window in FIG. 3(a) and the corresponding position in the search area.
Figure 5A:
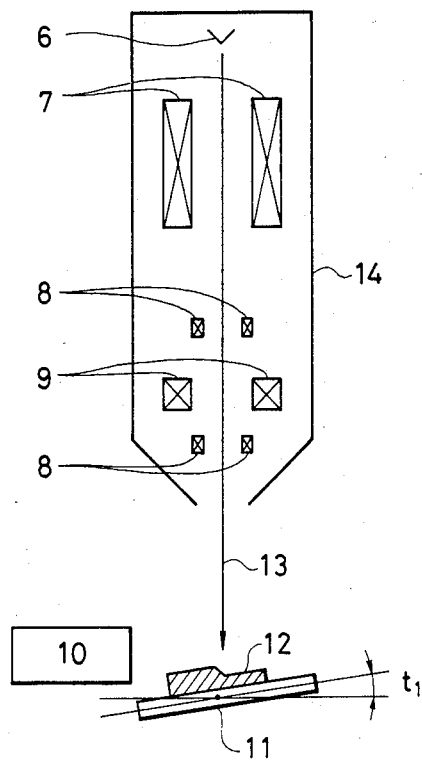
FIGS. 5(a) and 5(b) is an illustration of the arrangement a scanning electron microscope and a specimen bed for stereoscopic measurement.
Figure 5B:
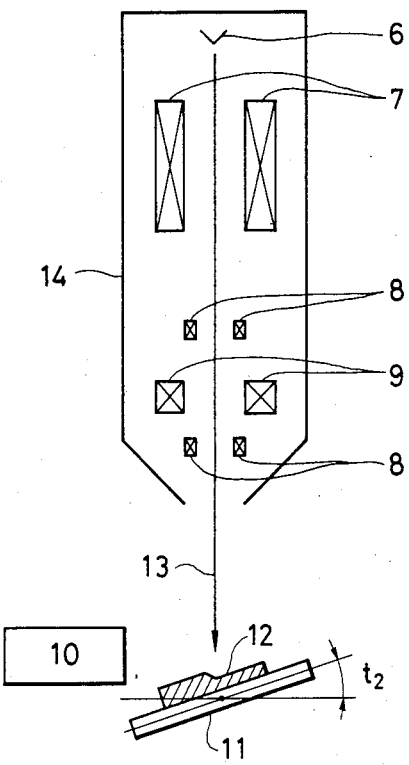

FIGS. 5(a) and 5(b) show an arrangement of a scanning electron microscope (SEM) 14, a specimen table 11 and a detector 10, which are used in a stereoscopic measuring method of the invention.

The electron beam 13 emitted from an electronic gun 6 of an electron microscope 14 is converged by an electron lens system having a condenser lens 7, objective lens 9 and so forth, and is applied to the surface of a specimen 12 such as to scan the objective area of the specimen 12. The specimen 12 thus applied with the electron beam emits secondary electrons and reflected electrons. Although the measurement can be conducted successfully by making use of the reflected electrons, the illustrated embodiment makes use of the secondary electrons. The secondary electrons emitted from the measuring object are detected by the detector 10 which produces signals for forming the image of the specimen surface as will be explained hereinunder.

FIG. 5(b) shows a state in which the specimen table 11 has been tilted slightly from the position shown in FIG. 5(a).

Figure 6A:
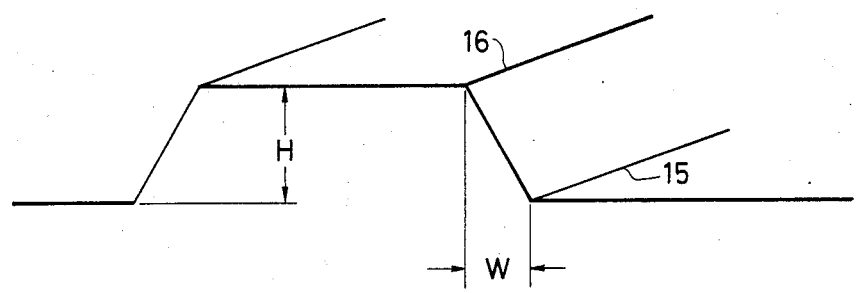
FIGS. 6(a) and 6(b) is an illustration of a portion of a step formed object to be measured.
Figure 6B:
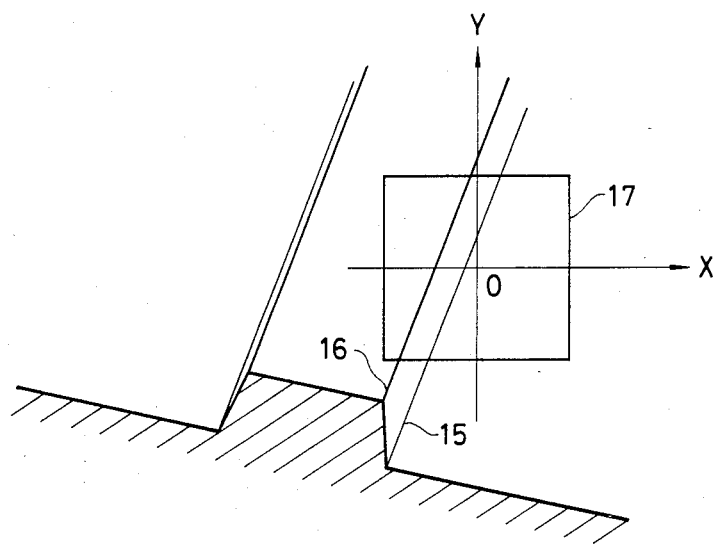
Figure 7A:
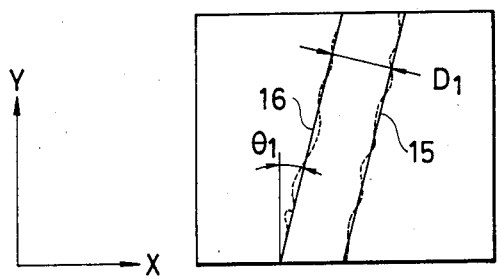
FIGS. 7(a) and 7(b) show examples of pictures obtained in the course of measurement.
Figure 7B:
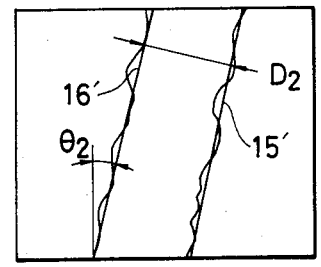

FIG. 6(b) shows a specific region 17 of a step formed object shown in FIG. 6(a) formed on a semiconductor wafer. FIGS. 7(a) and 7(b) shows an example of the picture obtained by measurement of the region 17. In FIGS. 6(a) and 6(b), H represents the height of the step formed object, W represents the width of the step formed object, 15 denotes the lower end edge of the step formed object, and 16 denotes the upper end edge of the step formed object.

The measurement of the height H and the width W of the step formed object is a matter of a great significance in grasping the shape of the step formed object which is, in this case, a resist or wiring on a semiconductor wafer. This significance will be increased as the degree of integration becomes higher.

The picture shown in FIG. 7(b) is obtained after the tilt of the specimen table 11 as shown in FIG. 5(b). As shown in FIGS. 7(a) and 7(b), the pictures showing the upper and lower ends of the step formed object have been distorted locally by the noise produced in the picture. According to the invention, a linear pattern such as those shown by full lines 15, 16 and 15', 16' in FIGS. 7(a) and 7(b) are obtained by the minimum square method employing the picture signals corresponding to said upper and lower end edges. The lines 15 and 16 run parallel with each other as shown in FIG. 7(a), also the lines 15' and 16' run parallel with each other as shown in FIG. 7(b).

The distances between the lower edge lines 15, 15' and the upper edge lines 16, 16' are expressed by $D_1$ and $D_2$, respectively. The angle formed between the edge line 15 or 16 and the Y-axis of coordinate shown in FIG. 7(a) is expressed by $\theta_1$ (this angle will be referred to as angle with respect to the picture axis), while the angle of the edge line 15' or 16' with respect to the axis of picture is represented by $\theta_2$. The angles of inclination of the electron beam with respect to the specimen table in FIGS. 5(a) and 5(b) are represented by $t_1$ and $t_2$, respectively (the angle of inclination will be referred to as inclination with respect to viewing direction, hereinunder).

Using these factors, the height H and the width W in FIGS. 6(a) and 6(b) are computed as follows:

$$H = -(D_1 \cos t_2 - D_2 \cos t_1)/\sin(t_1 - t_2) \quad (2)$$

$$W = (D_1 \sin t_2 - D_2 \sin t_1)/\sin(t_1 - t_2) \quad (3)$$

where, $t_1$ and $t_2$ are determined by substituting $i=1$ and $i=2$ in the following formula.

$$\tan^2 t_i = \tan^2 t_i \left(1 - \frac{\sin^2 \theta_i}{\cos^2 t_i + \sin^2 t_i \cdot \sin^2 \theta_i}\right)$$

Figure 8:
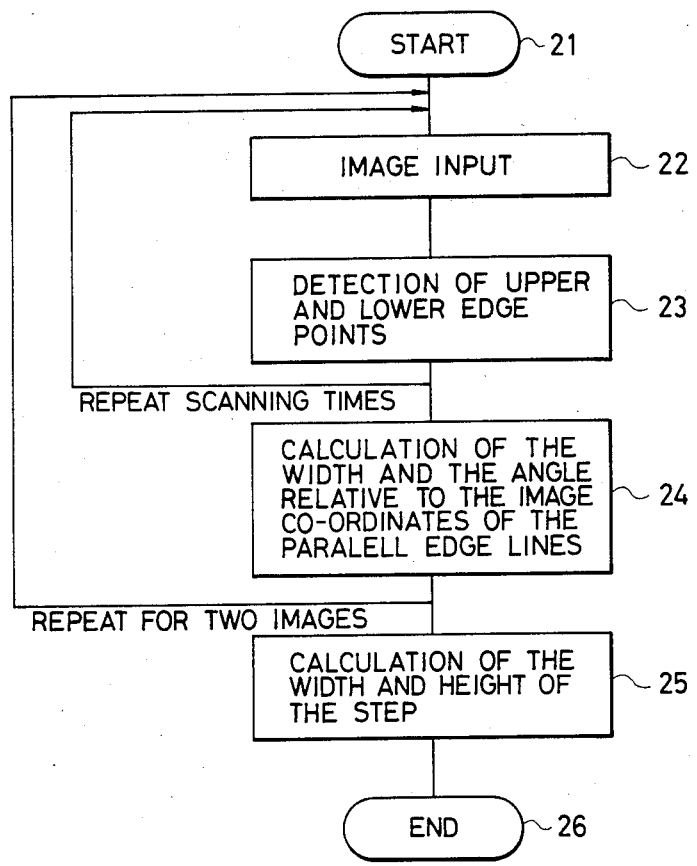
FIG. 8 is a flow chart showing the operation of the measuring system in accordance with the invention.

FIG. 8 shows the flow of the process of measurement in accordance with the measuring system of the invention.

After the start of the measurement in step 21, the images of the object to be measured is taken in two different directions in a step 22, followed by detection of the upper end edge and the lower end edge of the stepped object in the pictures in a step 23. This operation flow is repeated for the successive scanning lines.

Using the thus obtained data, the distances $D_1$, $D_2$ and the angles $\theta_1$, $\theta_2$ of the edge lines of the edges with respect to the axis of picture are repeatedly calculated in regard to FIGS. 7(a) and 7(b) from the parallel pictures of the upper and lower end edges, in the next step 24. Then, using the predetermined inclination angles $t_1$, $t_2$ (not shown) of the standard plane fixed to the step formed object with respect to the viewing direction, the height H and the width W of the desired step formed object are computed in a step 25, and the result of the computation is output in a step 26.

It is thus possible to measure the height H and width W of the step formed object which are necessary for the examination of the sectional shape of the step formed object.

Figure 9A:
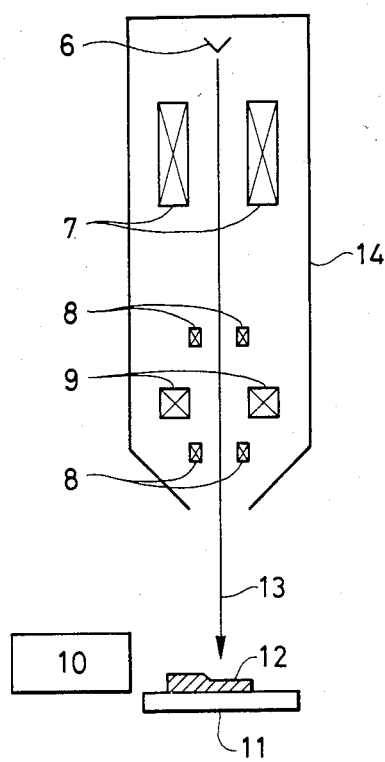
FIGS. 9(a) and 9(b) is an illustration of an arrangement of a scanning electron microscope and a specimen table in a stereoscopic measurement which is conducted by deflecting the electron beam.
Figure 9B:
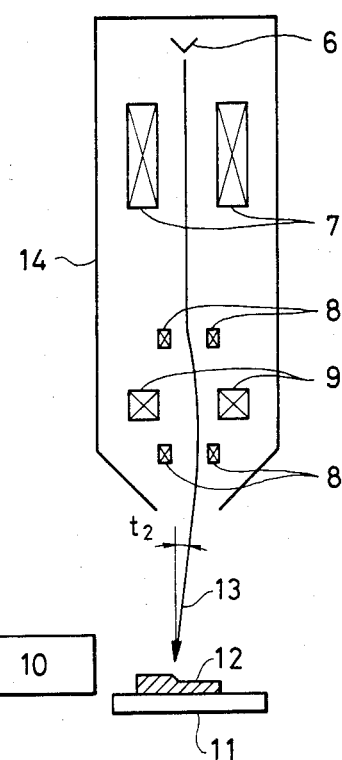

In the described embodiment, the specimen table carrying the specimen is tilted to permit the measurement by irradiation with the electron beam in different directions. The same measuring effect is obtained, however, by changing the incidence direction of the electron beam by deflecting the beam while fixing the specimen table as shown in FIGS. 9(a) and 9(b).

It is to be understood also that the irradiation by the electron beam may be effected in more than two directions, although the described embodiment employs only measurement in two directions.

The picking up of the image of the measuring object can be made conveniently by a scanning type electron beam microscope because it provides a clear picture which minutely reproduces fine features of the object surface, although the invention does not essentially require the use of the scanning electron microscope and the measurement can be made by other means which permits a digital processing to the picture.

As has been described, according to the invention, a deteriorated picture containing many local fluctuation is corrected by the minimum square method so as to enable the measurement of essential factors of the construction of a stepped object.

With this invention, therefore, it is possible to obtain an automatic sectional shape measuring system which permits a fast measurement with minimized influence of local fluctuation.

What is claimed is:

1. A method of automatically measuring the sectional shape of an object for determining the three-dimensional shape of said object from a plurality of pictures obtained in at least two different directions using an electron beam source and a scanning means, said method comprising the steps of:

detecting images of a step formed object to be measured in at least two different directions and forming a plurality of pictures corresponding to the detected image directions;

measuring the distances $D_1$, $D_2$ ... between upper end edges and lower end edges which are parallel to said upper end edges of said step formed object from said plurality of pictures;

determining angles $\theta_1$, $\theta_2$ ... of said edges with respect to an axis of said pictures;

determining inclination angles $t_1$, $t_2$ ... of said pictures with respect to a viewing direction; and determining the height H and the width W of said step formed object in accordance with the determined angles $\theta_1$, $\theta_2$ ... and inclination angles $t_1$, $t_2$ ....

2. A method of automatically measuring the sectional shape of an object according to claim 1, further comprising the steps of tilting a specimen table carrying the object, in order to detect the image of said object from at least two directions.

3. A method of automatically measuring the sectional shape of an object according to claim 1, wherein said electron beam is deflected so as to be applied to said object in at least two different directions so as to produce pictures through image detection in at least two different directions.

4. A method of automatically measuring the sectional shape of a step formed object using an electron beam source and a scanning means comprising the steps of:

forming pictures of said step formed object by detecting images of said object in two different directions;

determining distances $D_1$ and $D_2$ between upper edges and lower edges parallel to said upper edges of said stepped object from said pictures;

determining angles $t_1$, $t_2$ of inclination of a standard plane fixed to the step formed object with respect to the viewing direction; and determining the height H and width W of said step formed object in accordance with the following formulae:

$$H = -(D_1 \cos t_2 - D_2 \cos t_1)/\sin(t_1 - t_2)$$

$$W = (D_1 \sin t_2 - D_2 \sin t_1)/\sin(t_1 - t_2)$$

where $t_1$ and $t_2$ are obtained by substituting $i=1$ and $i=2$ into the following formula $$\tan^2 t_i = \tan^2 t_i' \left(1 - \frac{\sin^2 \theta_i}{\cos^2 t_i' + \sin^2 t_i' \cdot \sin^2 \theta_i}\right)$$

where $\theta_i$ represents an angle of an edge with respect to an axis of said picture.

* * * * *